US012769189B2

(12) United States Patent
Spring

(10) Patent No.: US 12,769,189 B2
(45) Date of Patent: Oct. 20, 2026

(54) OPTICAL DEVICE AND MANUFACTURING METHOD

(71) Applicant: AMS-OSRAM ASIA PACIFIC PTE. LTD., Singapore (SG)

(72) Inventor: Nicola Spring, Eindhoven (NL)

(73) Assignee: AMS-OSRAM ASIA PACIFIC PTE. LTD., Singapore (SG)

( * ) Notice: Subject to any disclaimer, the term of this patent is extended or adjusted under 35 U.S.C. 154(b) by 887 days.

(21) Appl. No.: 18/003,472

(22) PCT Filed: Jun. 23, 2021

(86) PCT No.: PCT/SG2021/050364
§ 371 (c)(1),
(2) Date: Dec. 27, 2022

(87) PCT Pub. No.: WO2022/005393
PCT Pub. Date: Jan. 6, 2022

(65) Prior Publication Data

US 2023/0244126 A1 Aug. 3, 2023

(30) Foreign Application Priority Data

Jun. 30, 2020 (GB) ..................................... 2009948

(51) Int. Cl.
*G03B 17/48* (2021.01)
*H01S 5/068* (2006.01)
(Continued)

(52) U.S. Cl.
CPC .......... *G03B 17/48* (2013.01); *H01S 5/06825* (2013.01); *H10F 39/026* (2025.01);
(Continued)

(58) Field of Classification Search
CPC .......................... H01S 5/06825; H10H 20/857
See application file for complete search history.

(56) References Cited

U.S. PATENT DOCUMENTS 10,667,341 B1 * 5/2020 Kriman .............. G02B 27/4233
11,211,536 B2 * 12/2021 Wu .................... H10H 20/8506
(Continued)

FOREIGN PATENT DOCUMENTS

EP 3304140 A1 4/2018
JP 2008046558 A 2/2008
(Continued)

OTHER PUBLICATIONS

International Search Report and Written Opinion from related PCT Appl. No. PCT/SG2021/050364, mailed Sep. 30, 2021, 8 pages.
(Continued)

*Primary Examiner* — Alexander P Gross
(74) *Attorney, Agent, or Firm* — VIERING, JENTSCHURA & PARTNER mbB

(57) ABSTRACT

An optical device (380) is disclosed, the device comprising a substrate (330), a first electrically-conductive element (325) formed as a pattern on the substrate, a layer of material extending over at least a portion of the first electrically-conductive element and forming an optical element (370), and a second electrically-conductive element (355) extending through the layer of material and coupled to the first electrically-conductive element. Also disclosed is an associated method of manufacturing the optical device (380), and an apparatus (600) comprising at least one of the disclosed optical devices, a camera (605), and processing circuitry (615) communicably coupled to the at least one optical device and to the camera.

19 Claims, 7 Drawing Sheets

(51) Int. Cl.
*H10F 39/00* (2025.01)
*H10H 20/857* (2025.01)

(52) U.S. Cl.
CPC ......... *H10F 39/804* (2025.01); *H10F 39/805* (2025.01); *H10F 39/806* (2025.01); *H10F 39/811* (2025.01); *H10H 20/857* (2025.01)

(56) References Cited

U.S. PATENT DOCUMENTS

| | | | | |
|---|---|---|---|---|
| 2011/0163340 | A1* | 7/2011 | Smith | H10K 59/871 438/27 |
| 2013/0256919 | A1 | 10/2013 | Scholz et al. | |
| 2019/0179107 | A1 | 6/2019 | Hsu et al. | |
| 2019/0278104 | A1 | 9/2019 | Chen | |
| 2021/0280632 | A1* | 9/2021 | Kim | H01L 25/0753 |

FOREIGN PATENT DOCUMENTS

| | | | | |
|---|---|---|---|---|
| JP | 2010100006 | A | * | 5/2010 |
| WO | 2020027721 | A1 | | 2/2020 |
| WO | 2020078285 | A1 | | 4/2020 |

OTHER PUBLICATIONS

UK Search Report issued in priority application, UK 2009948.7, mailed on Dec. 22, 2020, 4 pages.
German Office Action issued for the corresponding DE patent application No. DE 112021003673.4, dated Apr. 14, 2026, 4 pages.

* cited by examiner

OPTICAL DEVICE AND MANUFACTURING METHOD

CROSS-REFERENCE TO OTHER APPLICATIONS

This application is a United States National Phase Application of International Patent Application Number PCT/SG2021/050364, filed Jun. 23, 2021, entitled "OPTICAL DEVICE AND MANUFACTURING METHOD", which Application claims priority to United Kingdom patent application Ser. No. 2009948.7, filed on Jun. 30, 2020, the contents of which are incorporated herein by reference in their entirety.

TECHNICAL FIELD OF THE DISCLOSURE

The present disclosure is in the field of optical devices and wafer-level manufacturing of optical devices.

BACKGROUND OF THE DISCLOSURE

Optical devices, for example devices comprising passive optical components such as lenses and/or active optical components such as radiation sensors and emitters, are prevalent in many optical systems. For example, camera systems such as those implemented on cellular telephones and tablet devices may comprise multiple optical devices.

Such optical devices may be implemented as micro-optical devices, wherein physical dimensions of the devices are minimised for functional, practical and/or cost purposes. Cost-effective and extensively parallelized production methods at a wafer-level may be implemented for manufacturing such micro-optical devices.

Such optical devices may comprise electronic components, or may be required to provide an interface to electronic circuitry. For example, optical sensors may be required to provide signals to measurement circuitry. As such, optical devices may comprise circuitry and/or electronic components.

Furthermore, such optical devices manufactured at a wafer-level may be formed from layered stacks or assemblies of multiple components, which may require electrical connectivity between such components. In some instances, it may be desirable for connectivity between such components to be implemented without obstructing or obscuring optical elements within the device.

Existing techniques for implementing electrical connectivity between components in such micro-optical devices may require intricate geometries of components and complex processes to place electrical connections away from such optical elements. Furthermore, existing manufacturing techniques may result in large optical device sizes, which may detrimentally affect manufacturing costs and efficiencies. In particular, optical elements formed by processes such as injection moulding or replication may comprise excess material surrounding moulded or replicated optical elements, which may impose constraints upon an available space for the provision of electrical components. Due to such constraint, optical devices may be unduly large and/or complex.

It is therefore desirable to provide compact optical devices which comprise reliable electrical connectivity between components, and/or connectivity to further electronic components. Furthermore, it is also desirable to provide a method of manufacturing such an optical device.

It is therefore an aim of at least one embodiment of at least one aspect of the present disclosure to obviate or at least mitigate at least one of the above identified shortcomings of the prior art.

SUMMARY

The present disclosure relates to an optical device, associated methods of manufacturing the optical device, and apparatuses implementing the optical device. In particular, the optical device may be an optical device suitable for implementation in eye safety circuits in illuminators for 3D-sensing in smart-phone and automotive applications.

According to a first aspect of the disclosure, there is provided an optical device comprising: a substrate; a first electrically-conductive element formed as a pattern on the substrate; a layer of material extending over at least a portion of the first electrically-conductive element and forming an optical element; a second electrically-conductive element extending through the layer of material and coupled to the first electrically-conductive element.

Advantageously, by providing a second electrically-conductive element extending through the layer of material, rather than adjacent the layer of material as may be implemented in prior art optical devices, a compact optical device may be assembled. Such a compact optical device may provide a reliable electrical connection between the first electrically-conductive element and further components or circuits, via the second electrically-conductive element. Furthermore, by providing a smaller, compact optical device, over-all material costs may be reduced. That is, for wafer-level manufacturing of the optical device, a greater quantity of optical devices per wafer may be manufactured due to a reduced footprint of each individual optical device.

Advantageously, by providing a second electrically-conductive element extending through the layer of material, it would not be necessary to avoid any portion of excess material from the layer of material, known in the art as a 'yard', when forming an electrical connection to the first electrically-conductive element formed as a pattern on the substrate. Furthermore, the second electrically-conductive element may be, to an extent, protected by a surrounding portion of the layer of material, thus improving a reliability of the optical device. That is, at least a portion of an electrical connection to the first electrically-conductive element may be protected from moisture and/or oxidation at least in part due to an implementation of the second electrically-conductive element extending through the layer of material.

The pattern formed by the first electrically-conductive element may be, for example, a circuit. The pattern may be a trace, e.g. an electrical trace, such as a trace for coupling two or more components. The pattern may be a trace for electrically connecting a plurality of electrically-conductive elements extending through the layer of material. The pattern may define a meandering or winding trace extending across at least a portion of the substrate.

The second electrically-conductive element may form a conductive path extending from a surface of the layer of material to the first electrically-conductive element.

That is, at least a portion of a surface of the second electrically-conductive element may be flush with a surface of the layer of material. By extending from the surface, a further conductive element may be coupled directly to the second electrically-conductive element to form a circuit.

The second electrically-conductive element may comprise a cured conductive polymer. The second electrically-conductive element may comprise a cured conductive epoxy or acrylate.

The second electrically-conductive element may comprise a cured conductive liquid, adhesive, paste, glue, fluid, or the like. The second electrically-conductive element may comprise a cured conductive compound, wherein the conductive compound is provided as a suspension of conductive filaments or elements during manufacturing of the optical device. The second electrically-conductive element may be subsequently cured to form the second electrically-conductive element. Advantageously, application of such a curable conductive polymer, epoxy, acrylate, compound, or the like, may be substantially simpler and lower-cost that alternative methods of application of a conductive element, such as thin-film deposition methods, or solder reflow based methods.

The layer of material may comprise a cured polymer, epoxy, acrylate, or polydimethylsiloxane (PDMS).

The layer of material may comprise a polymer, e.g. a thermoplastic polymer, a polymer resin, or the like.

In other embodiments, the layer of material may comprise a material, such as Si (silicon), GaAs (gallium arsenide), $Si_3N_4$ (silicon nitride), SiO (silicon monoxide), SiN (silicon mononitride), SiON (silicon oxynitride), or the like. A selected material may depend, at least in part, upon a refractive index of the material required to achieve the desired properties of the optical element. Furthermore, a selected material may depend upon a method of manufacturing, such as vacuum injection molding or nanoimprinting, as described in more detail below.

The first electrically-conductive element may be an electrical trace for an eye safety circuit.

For example, the first electrically-conductive element may be, or may be coupled to, a trace extending over at least a portion of the optical element. The first electrically-conductive element may form a meandering or winding trace across at least a portion of the optical element. Beneficially, such an arrangement may permit detection of damage to the first element, such as by an impact or crack in the substrate. That is, beneficially the provision of the second electrically-conductive element extending through the layer of material and coupled to the first electrically-conductive element may permit coupling of detection circuitry to the first electrically-conductive element. Such detection circuitry may, for example, detect variation in a resistance of the first electrically-conductive element.

The optical element may comprise at least one of: a lens; a microlens array; a diffraction grating; a diffuser; a Fresnel lens; a filter; a waveguide. The optical element may be a passive optical element.

The second electrically-conductive element may be substantially spherical-frustum-shaped.

The second electrically-conductive element may be formed in the shape of a deposited droplet or bead of curable conductive material, e.g. a liquid or paste. The droplet or beam may comprise a first flattened surface coupled to the first electrically-conductive element and a second flattened surface substantially flush with and/or extending from a surface of the layer of material.

The second electrically-conductive element may be laterally surrounded by the layer of material.

Beneficially, the second electrically-conductive element may be protected by a surrounding portion of the layer of material, thus improving a reliability of the optical device.

The optical device may comprise a spacer. The spacer may comprise a third electrically-conductive element. The third electrically-conductive element may be conductively coupled to the first electrically-conductive element by the second electrically-conductive element.

The spacer and/or the third electrically-conductive element may be coupled to the second electrically-conductive element by a conductive adhesive, such as a curable conductive adhesive. The third electrically-conductive element may be an electrical trace.

The optical device may comprise a further substrate. The spacer may be disposed between the substrate and the further substrate. The first electrically-conductive element may be coupled to a fourth electrically-conductive element formed on the further substrate by the second and third electrically-conductive elements.

Beneficially, an active component or circuit disposed on the further substrate may be electrically connected to the first electrically-conductive element in a compact and reliable way by the second electrically-conductive element.

The optical device may comprise an active element. The active element may comprise at least one of: a sensor and/or a radiation emitter.

The radiation emitter may comprise one or more Vertical Cavity Surface Emitting Lasers (VCSEL). The active device may be configured to emit infra-red and/or visible radiation and/or ultraviolet (UV) radiation.

The sensor may comprise a proximity sensor, such as a direct or indirect time-of-flight sensor. The sensor may comprise a Single Photo Avalanche Diode (SPAD), or one or more arrays of SPADs.

The layer of material may be substantially transparent to radiation emitted by the radiation emitter and/or sensed by the sensor.

As such, a beam of radiation emitted or detected by an active device disposed on the further substrate may pass through the layer or material. The optical element formed on the layer of material may alter the beam of radiation. For example, the optical element may at least partially diffuse, filter, refract or focus the beam of radiation. The optical element may alter a phase of the beam of radiation.

The first electrically-conductive element may be substantially transparent to radiation emitted by the radiation emitter and/or sensed by the sensor.

As such, a beam of radiation emitted or detected by an active device disposed on the further substrate may pass through the layer or material and the first electrically-conductive element. Beneficially, such transparency may be suited to eye-safety applications, wherein the first electrically-conductive element may form a meandering trace across at least a portion of the optical element for purposes of detecting damage to the optical element, but without unduly impacting upon an optical performance of the optical device.

The first electrically-conductive element may be formed from a transparent conducting film.

The first electrically-conductive element may comprise a transparent conducting oxide. The first electrically-conductive element may comprise at least one of: indium tin oxide; fluorine doped tin oxide; and/or doped zinc oxide. The first electrically-conductive element may comprise an organic film, such as a film comprising carbon nanotube networks and/or graphene.

The optical device may comprise circuitry configured to detect a variation in a resistance of a circuit formed from the first electrically-conductive element.

Beneficially the provision of the second electrically-conductive element extending through the layer of material and coupled to the first electrically-conductive element may permit coupling of the circuitry to the first electrically-conductive element. Beneficially, the optical device may be suitable for eye-safety applications.

The optical device may be one of: an illuminator; a proximity sensor; a spectral sensor; an ambient light sensor; a dot-projector; a light-to-frequency sensor.

The optical device may be a flood illuminator.

According to a second aspect of the disclosure, there is provided method of manufacturing an optical device, the method comprising the steps of: dispensing a curable conductive material onto a tool; disposing the tool relative to a substrate such that the curable conductive material contacts a first electrically-conductive element formed as a pattern on the substrate; curing the curable conductive material to form a second electrically-conductive element coupled to the first electrically-conductive element; forming a layer of material between the tool and the substrate such that the second electrically-conductive element extends through the layer of material, a profile of the tool configured to define an optical element in the layer.

The method may be a method of wafer-level manufacturing of a plurality of optical devices.

The step of dispensing a curable conductive material onto a tool may comprise screen-printing. The step of dispensing the curable conductive material onto a tool may comprise jetting.

The curable conductive material may be dispensed as droplets or beads on the tool. The curable conductive material may be dispensed in a liquid, gel or paste form.

The tool may be formed from PDMS. The tool may be formed from a machined wafer or plate. A surface profile of the tool may define the optical element. That is, the tool may comprise a negative of the optical element. As such, the tool may be suitable for replication using imprinting or vacuum injection moulding of the layer of material to form the optical element.

The tool may be held in a clamp or chuck, such as a vacuum chuck. The substrate may be held in a clamp or chuck, such as a vacuum chuck. As such, the step of disposing the tool relative to a substrate such that the curable conductive material contacts a first electrically-conductive element formed as a pattern on the substrate may comprise moving/positioning either or both of the tool or the substrate.

The step of disposing the tool relative to a substrate such that the curable conductive material contacts a first electrically-conductive element formed as a pattern on the substrate may comprise applying pressure to deform the droplets or beads of curable conductive material such that a sufficient surface area of the droplets or beads of curable conductive material is in contact with the first electrically-conductive element.

Beneficially, an increased surface area providing electrical connectivity between the first electrically-conductive element and the curable conductive material may improve a reliability of the electrical performance of the optical device.

The step of curing the curable conductive material to form a second electrically-conductive element may cause the curable conductive material to solidify and/or bond to the first electrically-conductive element.

The step of forming a layer of material between the tool and the substrate may comprise vacuum injection moulding.

The step of forming a layer of material between the tool and the substrate may comprise imprinting, such as nano-imprinting.

The step of curing the conductive polymer may comprise thermal and/or UV curing of the conductive polymer.

The step of curing the conductive polymer may comprise addition of one or more curatives or hardeners.

According to a third aspect of the disclosure, there is provided an apparatus comprising: at least one optical device according to the first aspect, a camera; and processing circuitry communicably coupled to the at least one optical device and to the camera.

The apparatus may be a smart-phone or a tablet device.

According to further aspects of the invention, there is provided an automotive system comprising at least one optical device according to the first aspect. The automotive system may be a LiDAR (light detection and ranging) system. The at least one optical device may form at least a component of an illuminator in the LiDAR system.

According to further aspects of the invention, there is provided a smart-phone or tablet device comprising at least one optical device according to the first aspect. The at least one optical device may form at least a component of an illuminator in the smart-phone or tablet device.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE PREFERRED EMBODIMENTS

These and other aspects of the present disclosure will now be described, by way of example only, with reference to the accompanying drawings, wherein:

FIG. 1 depicts a disassembled prior art optical device;

FIG. 2*a* depicts a disassembled prior art optical device;

FIG. 2*b* depicts an assembled prior art optical device;

FIG. 3*a* a step of dispensing a curable conductive material onto a tool;

FIG. 3*b* a step of disposing the tool relative to a substrate;

FIG. 3*c* a step of curing the curable conductive material;

FIG. 3*d* a step of forming a layer of material between the tool and the substrate;

FIG. 3*e* depicts the substrate with the tool removed;

FIG. 3*f* depicts a cross-section of a portion of the optical device;

FIG. 4*a* depicts a disassembled optical device according to an embodiment of the disclosure;

FIG. 4*b* depicts an assembled optical device of FIG. 4*a;*

DETAILED DESCRIPTION OF THE PREFERRED EMBODIMENTS

Figure 1:
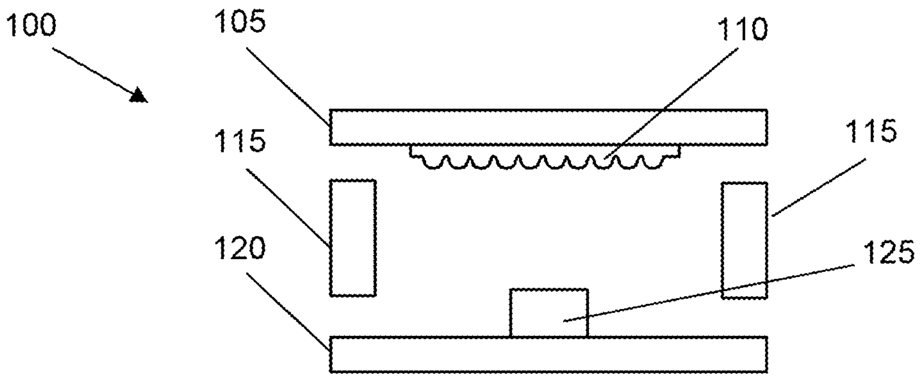

FIG. 1 depicts a disassembled, cross-sectional and simplified view of a prior art optical device 100.

The optical device 100 comprises a substrate 105, such as a glass or silicon substrate. An optical element 110 is formed or mounted on the substrate 105. For example, the optical element 110 may be a microlens array, or the like.

The optical device 100 comprises a further substrate 120, such as a glass or silicon substrate.

For purposes of example, an active device 125 is depicted mounted on the further substrate 120. The active device 125 may be a laser diode, an LED, a sensor or the like.

The prior art optical device 100 also comprises a spacer 115. The spacer 115 may be formed from a hole, void or bore formed in a substrate. The spacer 115 may be suitable for mounting on the further substrate 120 such that the active device 125 is located within the hole, void or bore.

Figure 2A:
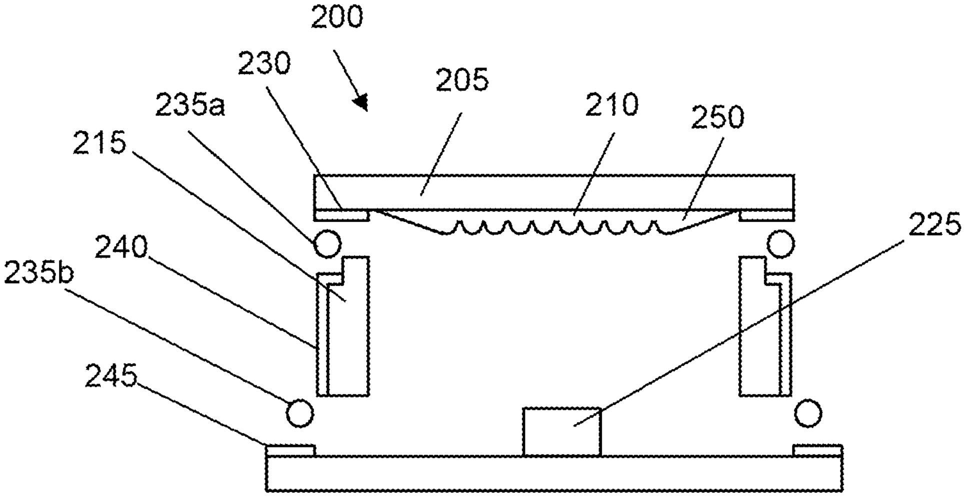

FIG. 2*a* depicts cross-sectional view of a disassembled prior art optical device 200. The prior art optical device 200 is similar to the prior art optical device 100 of FIG. 1, except further detailed with regard to electrical connectivity within the device is depicted.

The prior art optical device 200 comprises a substrate 205, such as a glass or silicon substrate. The substrate 205 has an optical element 210 formed or mounted on the substrate 205. For example, the optical element 210 may be a microlens array, or the like.

The optical element 210 may be formed by a process of replication or moulding. During formation of the optical element 210, excess material 250 may be formed at a periphery of the optical element 210. The excess material 250 may be known in the field as “a yard”. Such excess material 250 laterally surrounds the optical element 210. Therefore, a substantial surface area of the substrate 205 may be required for the excess material 250, thus increasing an overall module size of the optical device 200.

A first electrically-conductive element 230 is formed on the substrate 205. The first electrically-conductive element 230 may be an electrical contact.

The optical device 200 comprises a further substrate 220, such as a glass or silicon substrate.

For purposes of example, an active device 225 is depicted mounted on the further substrate 220. The active device 225 may be a laser diode, an LED, a sensor or the like.

An electrically-conductive trace 245 is also formed on the further substrate 220.

The prior art optical device 200 also comprises a spacer 215. The spacer 215 may be formed from a hole, void or bore formed in a substrate. The spacer 215 may be suitable for mounting on the further substrate 220 such that the active device 225 is located within the hole, void or bore.

An electrically-conductive trace 240 is formed on the spacer 215.

Also depicted is electrically-conductive glue 235*a* which may be used to adhere the spacer 215 to the substrate 205. More specifically, the electrically-conductive glue 235*a* may be used to electrically couple the electrically-conductive trace 240 formed on the spacer 215 to the first electrically-conductive element 230 formed on the substrate 205.

Also depicted is electrically-conductive glue 235*b* which may be used to adhere the spacer 215 to the further substrate 220. More specifically, the electrically-conductive glue 235*b* may be used to electrically couple the electrically-conductive trace 240 formed on the spacer 215 to the electrically-conductive trace 245 formed on the further substrate 220.

Figure 2B:
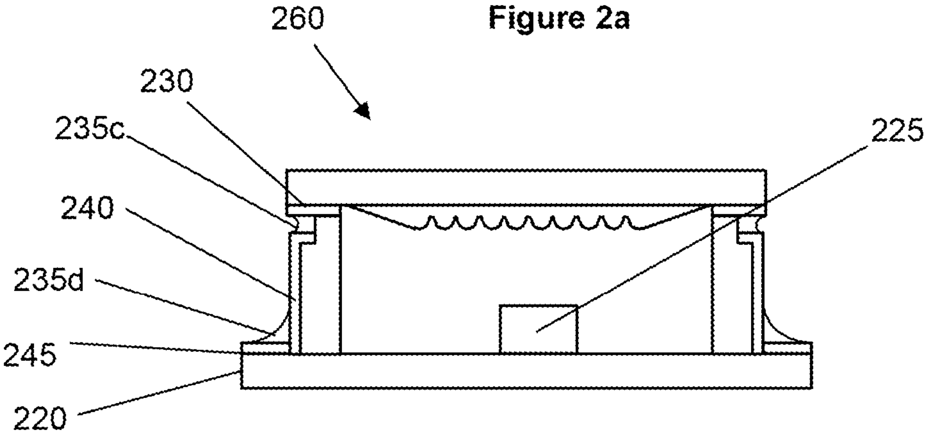

FIG. 2*b* depicts a cross section of an assembled prior art optical device 260. That is, the assembled prior art optical device 260 corresponds to the disassembled prior art optical device 200.

The cured electrically-conductive glue 235*c* adheres the spacer 215 to the substrate 205. More specifically, the cured electrically-conductive glue 235*c* electrically couples the electrically-conductive trace 240 formed on the spacer 215 to the first electrically-conductive element 230 formed on the substrate 205.

Due to the excess material 250, a location at which the substrate 205 is adhered to the spacer 215 is a substantial distance from the optical element 210 and as such, the optical device 200 may be relatively large.

The cured electrically-conductive glue 235*d* adheres the spacer 215 to the further substrate 220. More specifically, the cured electrically-conductive glue 235*d* electrically couples the electrically-conductive trace 240 formed on the spacer 215 to the electrically-conductive trace 245 formed on the further substrate 220.

FIGS. 3*a* to 3*f* depict a series of steps defining a method of manufacturing an optical device 380 according to an embodiment of the disclosure. The method may be a method of wafer-level manufacturing of a plurality of optical devices 380.

Figure 3A:
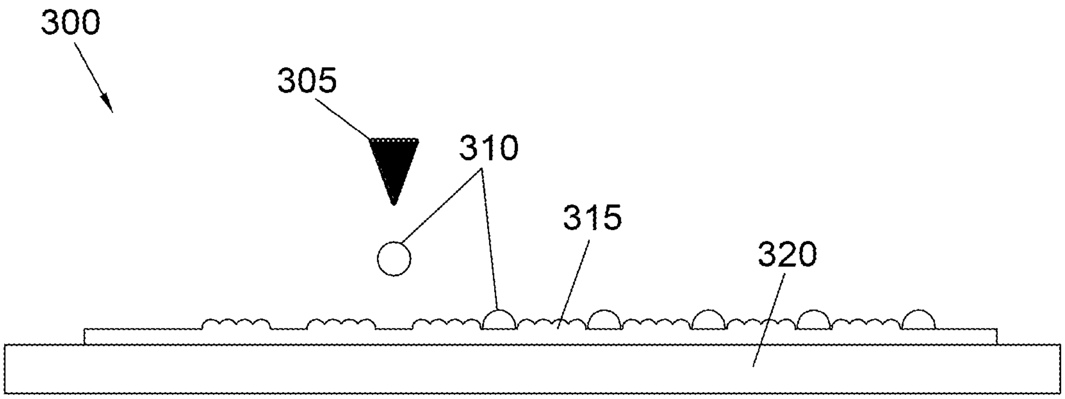

FIG. 3*a* depicts a first step 300 of step of dispensing a curable conductive material 310 on a tool 315.

The tool may be formed from PDMS 315. The tool 315 may be formed from a machined wafer or plate. A surface profile of the tool 315 may define an optical element 370. That is, the tool 315 may comprise a negative of the optical element 315. The tool 315 may be suitable for use in a process of replication using vacuum injection moulding or imprinting of a layer of material 365, to form the optical element 370.

The tool 315 may be held in a clamp or chuck, such as a vacuum chuck. In the example embodiment of FIG. 3*a*, the tool 315 is disposed on a back plate 320.

A nozzle 305 is depicted in FIG. 3*a* dispensing the curable conductive material 310 on the tool 315. While only a single nozzle is depicted in FIG. 3*a*, it will be appreciated that a plurality of nozzles may simultaneously or sequentially deposit the curable conductive material 310 on the tool 315.

Furthermore, in some embodiments the step of dispensing the curable conductive material 310 on the tool 315 may comprise screen-printing. In some embodiments the step of dispensing the curable conductive material onto a tool may comprise jetting.

The curable conductive material 310 may be dispensed as droplets or beads on the tool 315. The curable conductive material 310 may be dispensed in a liquid, gel or paste form.

In the example of FIG. 3*a*, the curable conductive material 310 is dispensed in a region of a surface of the tool 315 between regions of the surface profile of the tool 315 that define the optical element 370. The curable conductive material 310 may comprise a conductive polymer. The curable conductive material 310 may comprise a conductive epoxy or acrylate. The curable conductive material 310 may comprise a conductive liquid, adhesive, paste, glue, fluid, or the like.

Figure 3B:
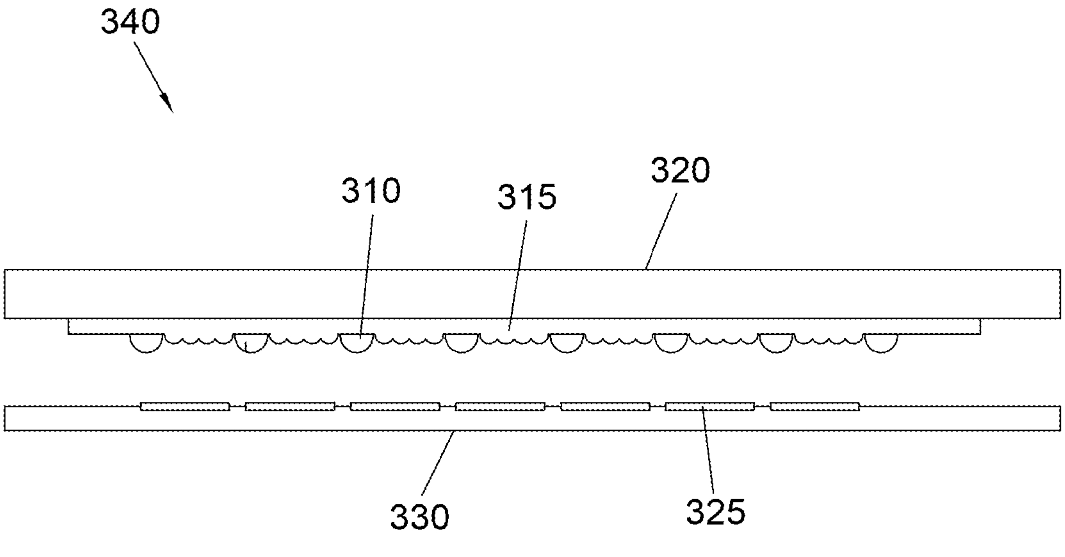

FIG. 3*b* depicts a second step 340 of disposing the tool 315 relative to a substrate 330. The substrate 330 may be a glass wafer, a silicon wafer or the like.

A first electrically-conductive element 325 is formed as a pattern on the substrate 330. For example, the first electrically-conductive element 325 may be formed on the substrate 330 by a process of thin film deposition and/or by printing. The first electrically-conductive element 325 may be formed from a transparent conducting film, such as a transparent conducting oxide. In an embodiment, the first electrically-conductive element 325 comprises indium tin oxide.

The second step 340 comprises disposing the tool 315 relative to the substrate 330 such that the curable conductive material 310 contacts a first electrically-conductive element 325. Furthermore, a force may be applied to the tool 315 and/or substrate to push the tool 315 and substrate together such that the droplets or beads of curable conductive material 310 are deformed. Beneficially, this may ensure a sufficient surface area of the droplets or beads of curable conductive material 310 is in contact with the first electrically-conductive element 325.

Figure 3C:
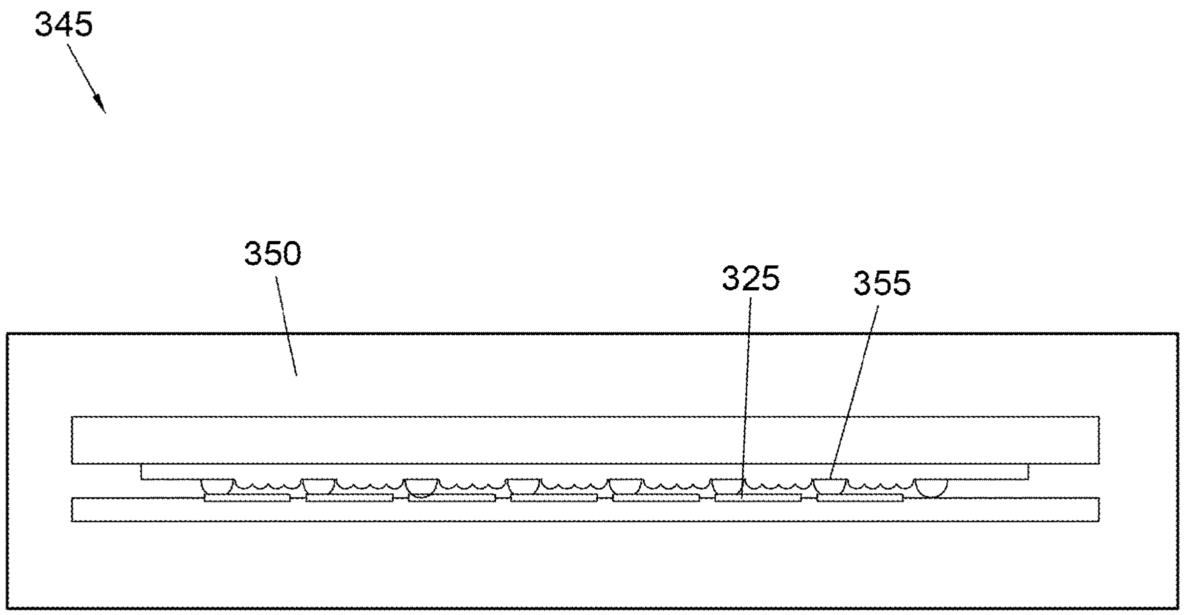

In a third step 345 depicted in FIG. 3*c*, the curable conductive material 310 is cured to form a plurality of second electrically-conductive elements 355. In some embodiments. Curing the curable conductive material 310 to form the second electrically-conductive elements causes the curable conductive material to solidify and/or bond to the first electrically-conductive element 325.

The curing may be performed in an oven 350. The curing may comprise thermal and/or ultraviolet (UV) curing.

Figure 3D:
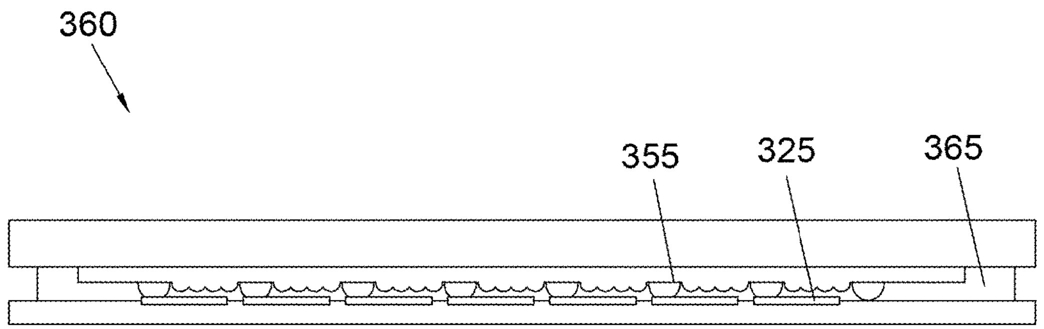

FIG. 3*d* depicts a fourth step 360 of forming a layer of material 365 between the tool 315 and the substrate 330.

In some embodiments, the step 360 of forming the layer of material 365 between the tool 315 and the substrate 330 may comprise vacuum injection moulding.

For example, the tool 315 and/or back plate 320 may comprise one or more vents of channels (not shown) for injecting, forcing, pumping or otherwise motivating material to form the layer of material 365. In other embodiments, the material may be injected, forced, pumped or otherwise motivated directly into a gap between the substrate 330 and the tool 315, e.g. at the sides/periphery of the substrate 330.

In some embodiments, the step 360 of forming the layer of material 365 between the tool 315 and the substrate 330 may comprise imprinting, such as nanoimprinting.

The material may be cured, e.g. thermally and/or UV cured, such that the material forms a hardened layer of material 365.

Figure 3E:
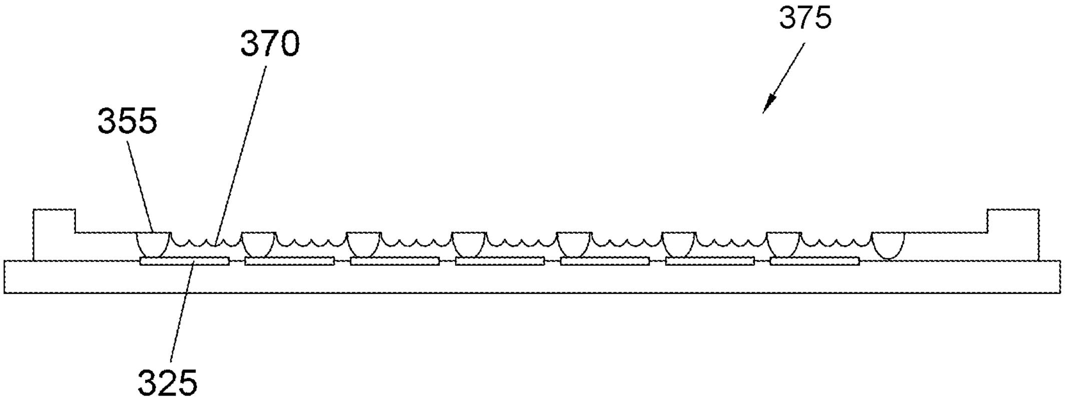

A fifth step 375 is depicted in FIG. 3*e*, wherein the tool 315 is removed from the substrate 330. In some embodiments, the substrate 330 may subsequently undergo singulation, e.g. dicing, to form a plurality of optical devices 380. In some embodiments, substrate 330 may be used in subsequent steps of assembling one or more optical devices 380, wherein singulation occurs only after one or more of such subsequent steps. That is, assembly of the one or more optical devices 380 may be performed at a wafer-level, or assembly of the one or more optical devices 380 may be performed at a device-level.

Figure 3F:
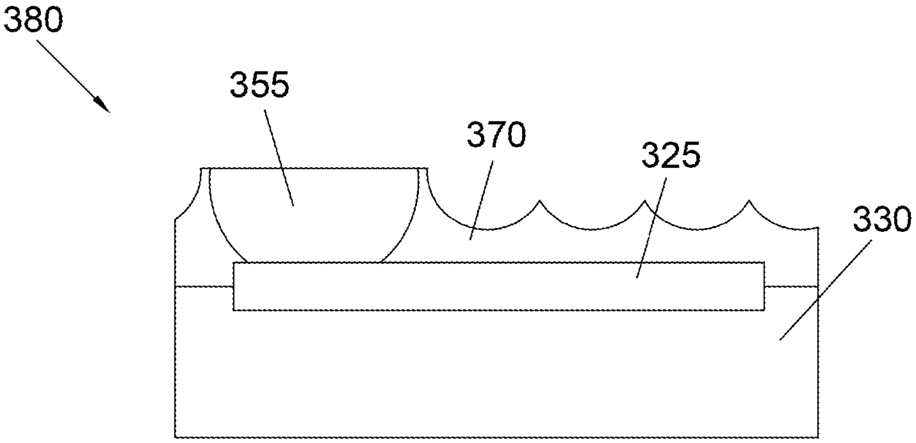

FIG. 3*f* depicts a cross-section of a portion of an optical device 380 manufactured according to the steps described with reference to FIGS. 3*a* to 3*d*. The second electrically-conductive element 355 extends through the layer of material 365, wherein the layer of material 365 defines an optical element 370.

Figure 4A:
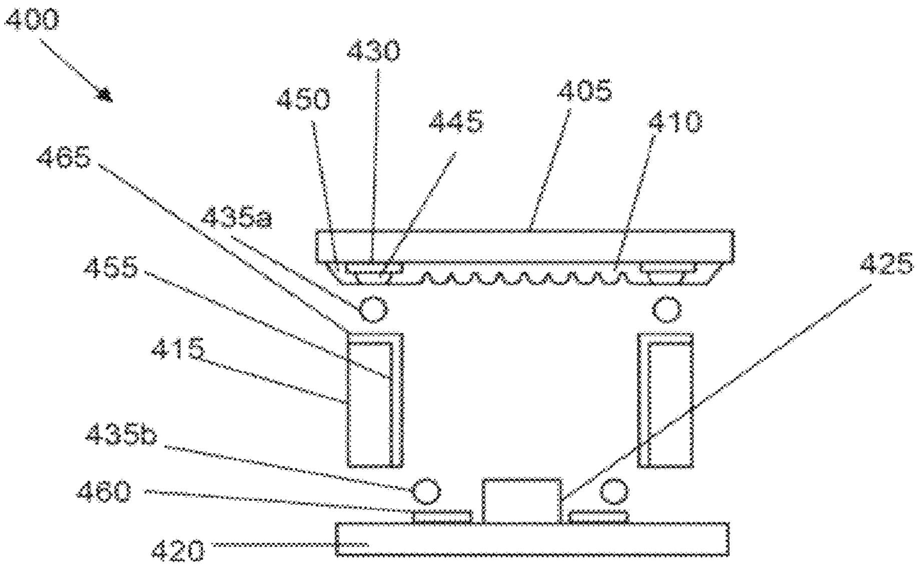

FIG. 4*a* depicts a disassembled optical device 400 according to an embodiment of the disclosure.

The optical device 400 comprises a substrate 405, such as a glass or silicon substrate. The substrate 405 has an optical element 410 formed or mounted on the substrate 405. For example, the optical element 410 may be a microlens array, or the like.

The optical element 410 may be formed by a process of replication or moulding, as described above with reference to FIG. 3*d*. During formation of the optical element 410, excess material 450 may be formed at a periphery of the optical element 410. That is, such excess material 450 may laterally surround the optical element 410.

A first electrically-conductive element 430 is formed on the substrate 405. The first electrically-conductive element 430 may be an electrical contact. The first electrically-conductive element 430 forms a pattern, e.g. at least a portion of a circuit.

In contrast to the prior art devices of FIGS. 2*a* and 2*b*, a second electrically-conductive element 445 extends through the layer of material that forms the optical element 410. In particular, the second electrically-conductive element 445 extends through the excess material 450 formed at the periphery of the optical element 410.

The optical device 400 also comprises a spacer 415. The spacer 415 is be formed from a hole, void or bore formed in a substrate.

A third electrically-conductive element 455 is formed on the spacer 415. In the embodiment depicted in FIG. 4*a*, the third electrically-conductive element 455 is formed on an inside surface of the hole, void or bore forming the spacer 415.

In some embodiments, the third electrically-conductive element 455 may be an electrical trace, such as a printed trace. In some embodiments, the third electrically-conductive element 455 may be implemented as a thin film layer or as a coating.

The optical device 400 comprises a further substrate 420, such as a glass or silicon substrate. An active device 425 is depicted mounted on the further substrate 420. The active device 425 may be a laser diode, an LED, a sensor or the like.

The spacer 415 is for mounting on the further substrate 220 such that the active device 225 is located within the hole, void or bore.

The third electrically-conductive element 455 extends over an upper portion 465 of the spacer 415.

A fourth electrically-conductive element 460 is formed on the further substrate 400. The fourth electrically-conductive element 460 may be an electrical trace.

Also depicted is electrically-conductive glue 435*a* which may be used to adhere the spacer 415 to the substrate 405. More specifically, the electrically-conductive glue 435*a* may be used to electrically couple the second electrically-conductive element 445 which extends through the layer forming the optical element 410, to the third electrically-conductive element 455 formed on the spacer 415.

Also depicted is electrically-conductive glue 435*b* which may be used to adhere the spacer 415 to the further substrate 420. More specifically, the electrically-conductive glue 435*b* may be used to electrically couple the third electrically-conductive element 455 formed on the spacer 415 to the fourth electrically-conductive element 460 formed on the further substrate 420.

Figure 4B:
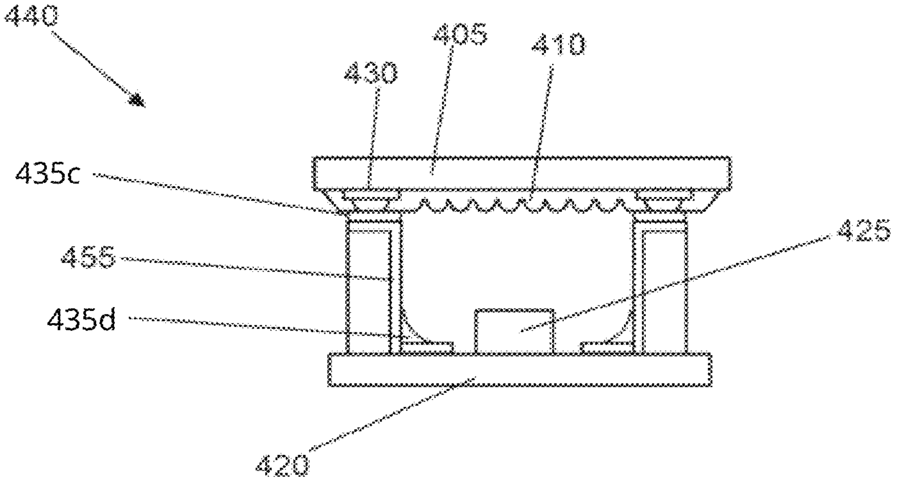

FIG. 4*b* depicts a cross section of an assembled optical device 440. That is, the assembled optical device 440 corresponds to the disassembled prior art optical device 400.

A cured electrically-conductive glue 435*c* adheres the spacer 415 to the substrate 405. More specifically, the cured electrically-conductive glue 435*c* electrically couples the second electrically-conductive element 445 which extends through the layer forming the optical element 410, to the third electrically-conductive element 415 formed on the spacer 415.

Also depicted is a cured electrically-conductive glue 435*d* adheres the spacer 415 to the further substrate 420. More specifically, the cured electrically-conductive glue 435*d* electrically couples the third electrically-conductive element 455 formed on the spacer 415 to the fourth electrically-conductive element 460 formed on the further substrate 420.

As such an electrical circuit is formed, wherein the first electrically-conductive element 430 is conductively coupled to the fourth electrically-conductive element 460 through the second electrically-conductive element 445, the third electrically-conductive element 455 and the electrically-conductive glue 435*a*, 435*b*.

In an embodiment of the disclosure, the optical device 440 is implemented in an eye-safety circuit in an illuminator, such as an illuminator for 3D-sensing in smart-phone and automotive applications.

Figure 5:
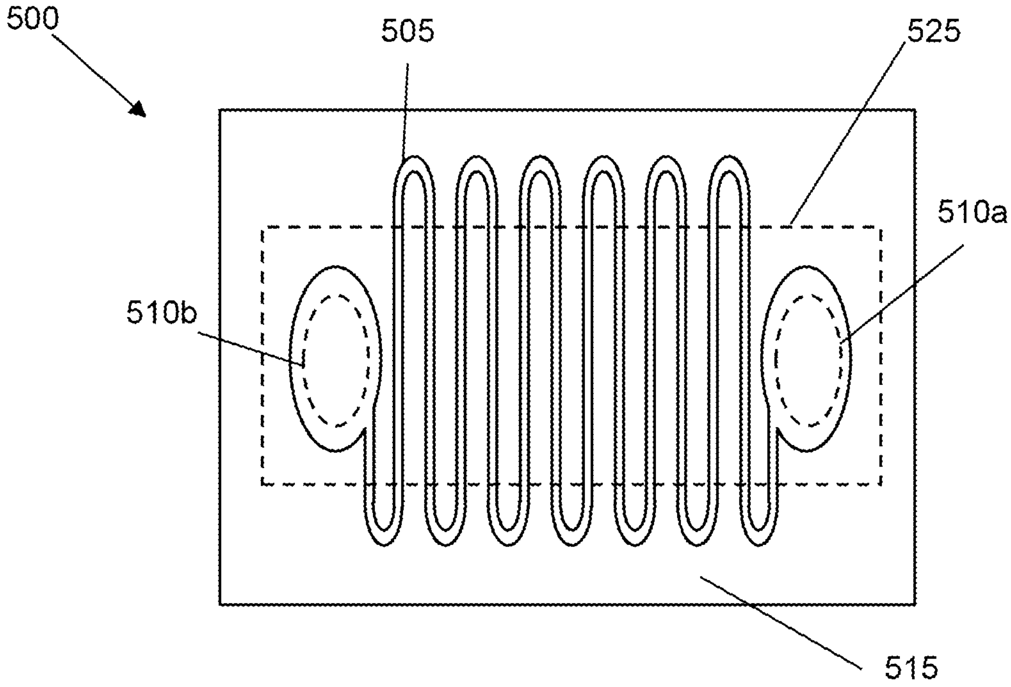
FIG. 5 depicts a plan view of the substrate showing the first electrically-conductive element, according to an embodiment of the disclosure.

FIG. 5 depicts a plan view of an optical device 500 for use in an eye-safety apparatus, such as an infrared illuminator. The optical device 500 comprises a substrate 515. For example, the substrate 515 of the optical device 500 of FIG. 5 may correspond to the substrate 405 of the optical device 440 of FIG. 4*b*.

A first electrically-conductive element 505 is formed on the substrate 515. The first electrically-conductive element 505 may correspond to the first electrically-conductive element 430 of the optical device 440 of FIG. 4*b*.

The first electrically-conductive element 505 forms a meandering or winding trace across at least a portion of the substrate 515. The precise pattern of the first electrically-conductive element 505 in FIG. 5 is shown for purposes of example only, and it will be appreciated that other patterns comprising other shapes or conductive paths may be implemented which fall within the scope of the present invention.

A plurality of second electrically-conductive elements 510*a*, 510*b* are coupled to the first electrically-conductive element 505. Each second electrically-conductive element 510*a*, 510*b*, may correspond to the second electrically-conductive element 445 of the optical device 440 depicted in FIG. 4*b*. Each second electrically-conductive element 510*a*, 510*b* extends through a layer or material 525 formed on the substrate 515, wherein the layer of material defines an optical element.

Such an arrangement may be used for detection of damage to the first electrically-conductive element 505, such as by an impact or crack in the substrate 515. For example, a change in the electrical resistance of the first electrically-conductive element 505 due to cracking, corrosion or damage, may be detected by an electrical circuit coupled to the first electrically-conductive element 505.

That is, beneficially the provision of the second electrically-conductive elements 510*a*, 510*b* extending through the layer of material and coupled to the first electrically-conductive element 505 may permit coupling of detection circuitry to the first electrically-conductive element 505 in a compact device. Such detection circuitry may, for example, be configured to detect variation in a resistance of the first electrically-conductive element 505.

Figure 6:
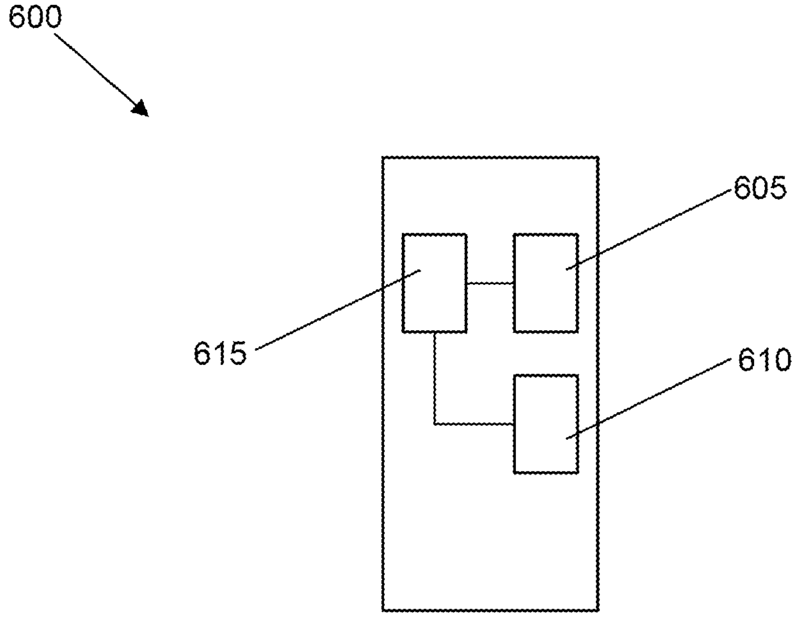
FIG. 6 depicts an example apparatus according to an embodiment of the disclosure.

FIG. 6 depicts an example apparatus 600 according to an embodiment of the disclosure. The example apparatus 600 may be a smart-phone, a tablet device, or the like. The apparatus 600 comprises an optical device 610 according to an embodiment of the disclosure. That is, the optical device 610 may be, or may comprise, an optical device 380 as manufactured according to the method described above with reference to FIGS. 3*a* to 3*f*.

The apparatus 600 also comprises an imaging device which, in some embodiments, may be a camera 605.

The apparatus 600 comprises processing circuitry 615 communicably coupled to the optical device 610 and to the camera 605.

In one embodiment, the optical device 610 may be a component of an infrared illuminator for use in conjunction with the camera 605, for example for determining a focus of the camera and/or for object recognition and/or proximity detection.

Figure 7:
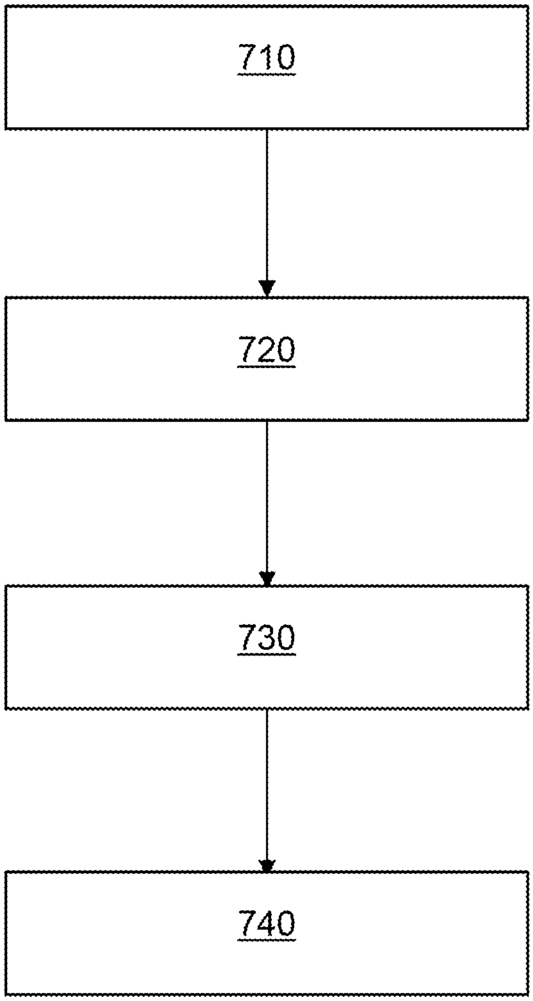
FIG. 7 a method of manufacturing an optical device according to an embodiment of the disclosure.

FIG. 7 depicts a method of manufacturing an optical device according to an embodiment of the disclosure.

A first step 710 of the method comprises dispensing a curable conductive material onto a tool.

A second step 720 comprises disposing the tool relative to a substrate such that the curable conductive material contacts a first electrically-conductive element formed as a pattern on the substrate.

A third step 730 comprises curing the curable conductive material to form a second electrically-conductive element coupled to the first electrically-conductive element.

A fourth step 740 comprises forming a layer of material between the tool and the substrate such that the second electrically-conductive element extends through the layer of material, wherein a profile of the tool is configured to define an optical element in the layer.

A further step may comprise removing the tool from the substrate.

In some embodiments, the substrate may subsequently undergo singulation, e.g. dicing, to form a plurality of optical devices. In some embodiments, substrate may be used in subsequent steps of assembling one or more optical devices, wherein singulation occurs only after one or more of such subsequent steps.

The Applicant discloses in isolation each individual feature described herein and any combination of two or more such features, to the extent that such features or combinations are capable of being carried out based on the specification as a whole in the light of the common general knowledge of a person skilled in the art, irrespective of whether such features or combinations of features solve any problems disclosed herein, and without limitation to the scope of the claims. The applicant indicates that aspects of the disclosure may consist of any such individual feature or combination of features. In view of the foregoing description it will be evident to a person skilled in the art that various modifications may be made within the scope of the disclosure.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

List of Reference Numerals

| | |
|---|---|
| 100 | optical device |
| 105 | substrate |
| 110 | optical element |
| 115 | spacer |
| 120 | further substrate |
| 125 | active device |
| 200 | optical device |
| 205 | substrate |
| 210 | optical element |
| 215 | spacer |

-continued

| List of Reference Numerals | |
|---|---|
| 220 | further substrate |
| 225 | active device |
| 230 | first electrically-conductive element |
| 235a | conductive glue |
| 235b | conductive glue |
| 235c | cured conductive glue |
| 235d | cured conductive glue |
| 240 | electrically-conductive trace |
| 245 | electrically-conductive trace |
| 250 | excess material |
| 260 | optical device |
| 300 | first step |
| 305 | nozzle |
| 310 | curable conductive material |
| 315 | tool |
| 320 | back plate |
| 325 | first electrically-conductive element |
| 330 | substrate |
| 340 | second step |
| 345 | third step |
| 350 | oven |
| 355 | second electrically-conductive element |
| 360 | fourth step |
| 365 | layer of material |
| 370 | optical element |
| 375 | fifth step |
| 380 | optical device |
| 400 | optical device |
| 405 | substrate |
| 410 | optical element |
| 415 | spacer |
| 420 | further substrate |
| 425 | active device |
| 430 | first electrically-conductive element |
| 435a | conductive glue |
| 435b | conductive glue |
| 435c | cured conductive glue |
| 435d | cured conductive glue |
| 440 | optical device |
| 445 | second electrically-conductive element |
| 450 | excess material |
| 455 | third electrically-conductive element |
| 460 | fourth electrically-conductive element |
| 465 | upper portion |
| 500 | optical device |
| 505 | first electrically-conductive element |
| 510a | second electrically-conductive element |
| 510b | second electrically-conductive element |
| 515 | substrate |
| 525 | optical element |
| 600 | Apparatus |
| 605 | camera |
| 610 | optical device |
| 615 | processing circuitry |
| 710 | first step |
| 720 | second step |
| 730 | third step |
| 740 | fourth step |

The invention claimed is:

1. A method of manufacturing an optical device, the method comprising the steps of:

dispensing a curable conductive polymer onto a tool;

disposing the tool relative to a substrate such that the curable conductive polymer contacts a first electrically-conductive element formed as a pattern on the substrate;

curing the curable conductive polymer to form a second electrically-conductive element coupled to the first electrically-conductive element; and forming a layer of material between the tool and the substrate such that the second electrically-conductive element extends through the layer of material, a profile of the tool configured to define an optical element in the layer.

2. The method of claim 1, wherein the step of forming a layer of material between the tool and the substrate comprises vacuum injection moulding.

3. The method of claim 1, wherein the step of curing the conductive polymer comprises thermal and/or UV curing of the conductive polymer.

4. The method of claim 1, wherein the curable conductive polymer is dispensed as droplets or beads on the tool.

5. The method of claim 4, wherein the step of disposing the tool relative to the substrate such that the curable conductive polymer contacts the first electrically-conductive element patterned on the substrate further comprises applying pressure to deform the droplets or beads of curable conductive polymer such that a sufficient surface area of the droplets or beads of curable conductive polymer is in contact with the first electrically-conductive element.

6. The method of claim 1, wherein the tool comprises a negative of the optical element.

7. The method of claim 6, wherein the tool comprises polydimethylsiloxane (PDMS) or machined wafer.

8. The method of claim 1, wherein the step of curing the curable conductive polymer to form the second electrically-conductive element comprises the curable conductive polymer bonding to the first electrically-conductive element.

9. The method of claim 1, wherein the second electrically-conductive element (355) is substantially spherical-frustum-shaped and the second electrically-conductive element is laterally surrounded by the layer of material.

10. The method of claim 1, wherein the second electrically-conductive element (355) forms a conductive path extending from a surface of the layer of material to the first electrically-conductive element.

11. The method of claim 1, wherein the layer of material comprises a cured polymer or PDMS.

12. The method of claim 1, wherein the first electrically-conductive element is an electrical trace for an eye safety circuit.

13. The method of claim 1, wherein the optical element comprises at least one of: a lens; a microlens array; a diffraction grating; a diffuser; a Fresnel lens; a filter; a waveguide.

14. The method of claim 1, comprising providing a spacer, the spacer comprising a third electrically-conductive element, the third electrically-conductive element being conductively coupled to the first electrically-conductive-element by the second electrically-conductive element.

15. The method of claim 1, comprising providing a further substrate, the spacer disposed between the substrate and the further substrate, the first electrically-conductive element coupled to a fourth electrically-conductive element formed on the further substrate by the second and third electrically-conductive elements.

16. The method of claim 1, comprising providing an active element, the active element comprising at least one of: a sensor and/or a radiation emitter.

17. The method of claim 16, wherein at least one of: the layer of material is substantially transparent to radiation emitted by the radiation emitter and/or sensed by the sensor; and the first electrically-conductive element is substantially transparent to radiation emitted by the radiation emitter and/or sensed by the sensor.

18. The method of claim 1, comprising providing circuitry configured to detect a variation in a resistance of a circuit formed from the first electrically-conductive element.

19. The method of claim 1, wherein the optical device is one of: an illuminator; a proximity sensor; a spectral sensor; an ambient light sensor; a dot-projector; a light-to-frequency sensor.

* * * * *